United States Patent
Thavarajah et al.

(10) Patent No.: US 6,872,321 B2
(45) Date of Patent: Mar. 29, 2005

(54) DIRECT POSITIVE IMAGE PHOTO-RESIST TRANSFER OF SUBSTRATE DESIGN

(75) Inventors: Manickam Thavarajah, San Jose, CA (US); Aritharan Thurairajaratnam, San Jose, CA (US); Alejandro Lacap, Union City, CA (US)

(73) Assignee: LSI Logic Corporation, Milpitas, CA (US)

( * ) Notice: Subject to any disclaimer, the term of this patent is extended or adjusted under 35 U.S.C. 154(b) by 279 days.

(21) Appl. No.: 10/254,708

(22) Filed: Sep. 25, 2002

(65) Prior Publication Data

US 2004/0056939 A1 Mar. 25, 2004

(51) Int. Cl.[7] ................................................ B44C 1/22
(52) U.S. Cl. ............................ 216/40; 216/41; 216/42; 427/259
(58) Field of Search ............................ 216/13, 40, 41, 216/44, 47; 438/745, 754; 427/259, 287; 430/302, 310, 326

(56) References Cited

U.S. PATENT DOCUMENTS 4,790,902 A * 12/1988 Wada et al. .................. 216/20
5,738,916 A * 4/1998 Noguchi et al. ............ 430/314
6,503,831 B2  1/2003 Speakman

* cited by examiner

Primary Examiner—Lan Vinh
(74) Attorney, Agent, or Firm—Traxler, Bushnell, Gaingiorgi & Blackstone Ltd.

(57) ABSTRACT

A method of forming a photo-resist image on a substrate, such as a conductive film. The method provides that a photo-resist image is printed directly onto the conductive film, such as by using an ink jet printer. Specifically, a CAD image may be sent from a computer to the ink jet printer, and the ink jet printer may use the CAD image to print the photo-resist image. The method may provide that a copper film is applied to a dielectric substrate, and then the photo-resist image is printed directly onto the copper film. Then, at least a portion of the copper film is removed, such as by etching, and at least a portion of the photo-resist image which has been printed on the copper film is removed, such as by etching. By printing the photo-resist image directly onto the copper film, it is not necessary to perform steps such as: applying a mask, exposing to UV light, and developing.

20 Claims, 3 Drawing Sheets

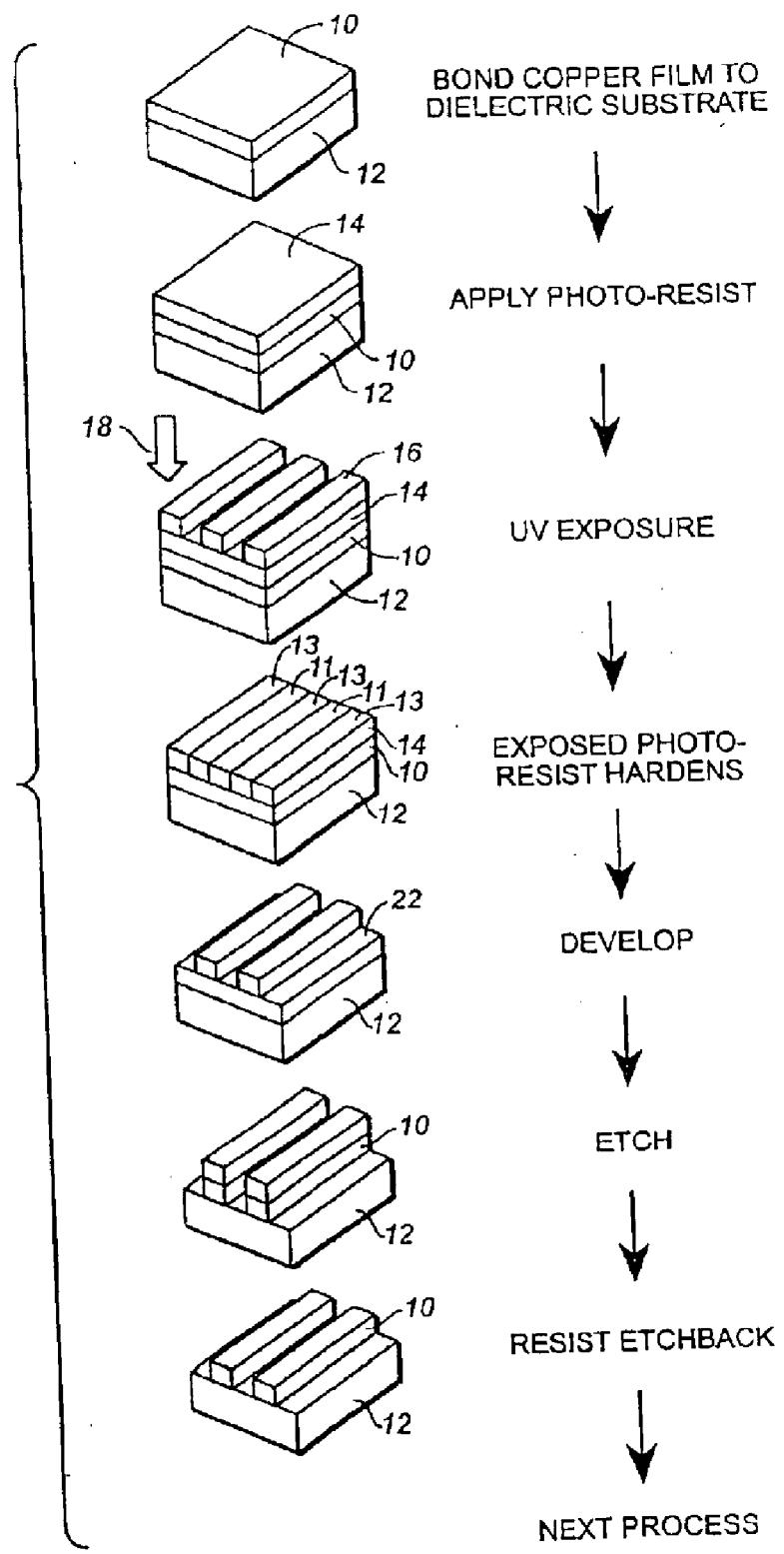
FIG._1
(PRIOR ART)

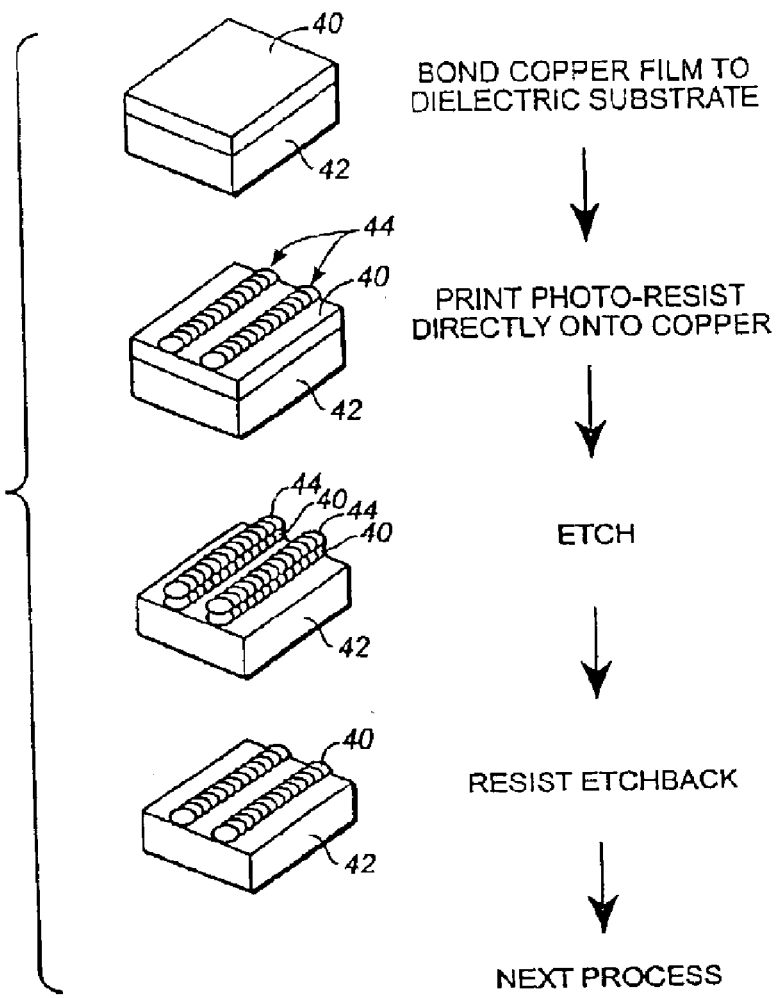
FIG._2
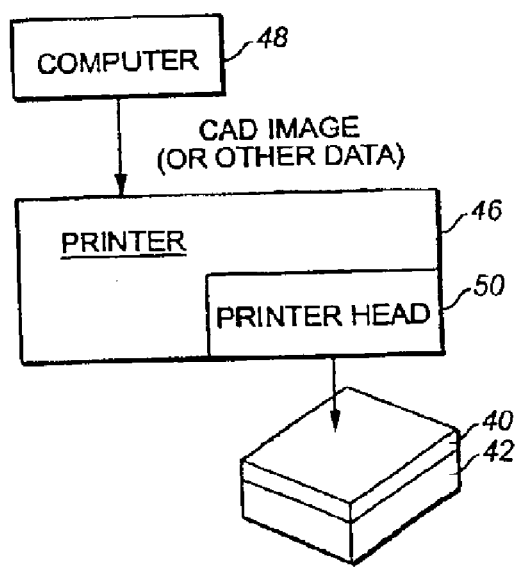
FIG._3

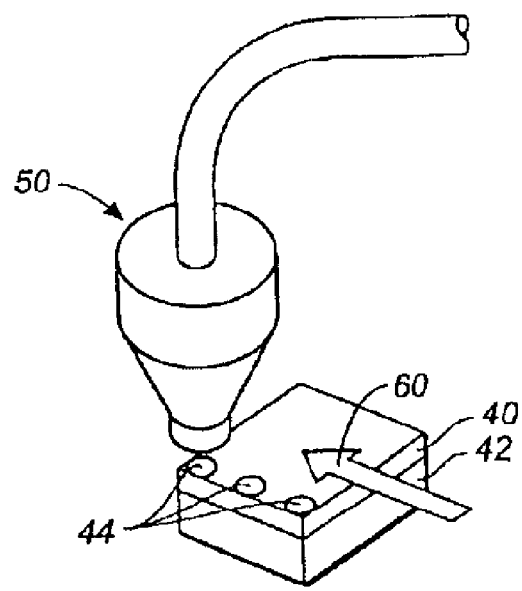
FIG._4
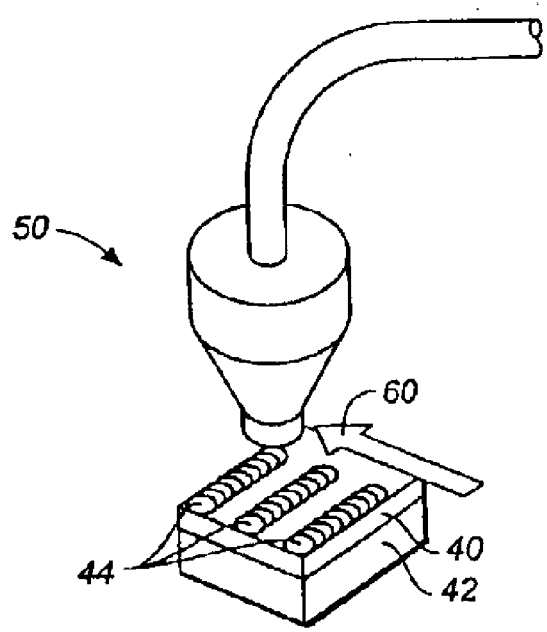
FIG._5

DIRECT POSITIVE IMAGE PHOTO-RESIST TRANSFER OF SUBSTRATE DESIGN

BACKGROUND

The present invention generally relates to the fabrication of organic substrates used in packaging integrated circuits (IC's), and more specifically relates to a method of creating a photo-resist unto the surface of a conductive plane during substrate fabrication.

The substrate of a typical IC package consists of one or more layers of metal circuitry bonded onto insulating or dielectric material. The dielectric base material is typically made from resins such as bismaleimide triazine (BT), cyanate esters, glass-reinforced epoxy or polyimides. These substrates provide mechanical support as well as electrical interconnection for the integrated circuit (IC) chip to one or more external devices.

Packaging substrates are typically manufactured in a series of mechanical and chemical steps, and often includes drilling, photo-imaging, electroless/electrolytic plating, etching, screen printing, routing and punching, and electrical/optical testing. Additional operations are required to manufacture multilayer boards in order to define and etch internal circuitry on thin laminates. These are then stacked and laminated or bonded into a multilayer structure.

To form an image or copper pattern onto the insulating or dielectric material, either "subtractive" or "additive" technology is typically used. Both technologies require the use of an ultraviolet (UV) light sensitive photo-resist to "mask" areas of concern. With subtractive technology, the use of copper-clad laminates necessitates the removal of copper in those regions where it is not wanted to form the copper routing or traces, and the required copper image is masked or covered by the photo-resist so that the "unwanted" areas can be subsequently etched away. FIG. 1 illustrates the steps performed in such a process. On the other hand, additive technology provides that unclad material is used, and copper is electrolessly added only where it is needed.

As shown in FIG. 1, a conductive film 10, such as copper film, is bonded to a dielectric substrate 12. Then, the copper surface is flooded with a photo-resist 14, where the photo-resist material is either in liquid form or is in the form of a dry film. Then, a photomask is generated, where the photomask is usually a stiff glass or a film containing the image of the spaces between the copper traces (hence the often-used term "negative image" of the substrate design). The photomask 16 is then aligned and pressed onto the photo-resist 14 while an ultraviolet light (represented by arrow 18) is beaming on the other side of the mask. Since the photomask 16 contains the opaque metallic image of the spaces between the copper traces, UV light is blocked or reflected back on those areas. On the other hand, UV light passes through the unmasked areas, penetrating and curing the photo-resist underneath the photo-mask. After this process, there are effectively two areas on the photo-resist, one that is exposed 11 or hardened, and the other which is unexposed 13 or uncured. A developing process then removes the unexposed photo-resist which in turn exposes the "unwanted" copper underneath. The "unwanted" copper 22 is then etched away chemically. The last major step of such a method of generating the copper pattern is a photo-resist etch back step where all the hardened photo-resist is removed or cleaned, leaving only the "wanted" copper patterns 10.

As such, the prior art process of forming a copper pattern or image on a dielectric substrate includes many steps, including steps such as masking, exposing the surface to UV light and developing. Additionally, state of the art equipment for practicing such a method is expensive, and conventional methods of applying a thin photo-resist often results in unstable etching quality. Furthermore, the wider width or space decreases the package available I/O, and productivity and/or quality is impacted.

OBJECTS AND SUMMARY

A general object of an embodiment of the present invention is to provide a method of making a positive photo-resist image or pattern onto a substrate.

Another object of an embodiment of the present invention is to provide a method of forming a conductive image or pattern on a dielectric substrate where the method requires less steps than a presently widely used method.

Still another object of an embodiment of the present invention is to provide a method of forming a photo-resist pattern without having to use a photo-mask and without having to perform steps of exposing the surface to UV light and developing.

Briefly, and in accordance with at least one of the foregoing objects, an embodiment of the present invention provides a method of forming a photo-resist image on a substrate, such as a conductive film. The method provides that a photo-resist image is printed directly onto the conductive film, such as by using an ink jet printer. Specifically, a CAD image may be sent from a computer to the ink jet printer, and the ink jet printer may use the CAD image to print the photo-resist image. The method may provide that a copper film is applied to a dielectric substrate, and then the photo-resist image is printed directly onto the copper film. Then, at least a portion of the copper film is removed, such as by etching, and at least a portion of the photo-resist image which has been printed on the copper film is removed, such as by etching. By printing the photo-resist image directly onto the copper film, it is not necessary to perform steps such as: applying a mask, exposing to UV light, and developing.

BRIEF DESCRIPTION OF THE DRAWINGS

The organization and manner of the structure and operation of the invention, together with further objects and advantages thereof, may best be understood by reference to the following description, taken in connection with the accompanying drawings, wherein:

FIG. 1 is a diagram which illustrates the steps of a prior art method of forming a conductive pattern on a dielectric substrate;

FIG. 2 is a diagram similar to FIG. 1, but illustrates the steps of a method of forming a conductive pattern on a dielectric substrate where the method is in accordance with an embodiment of the present invention;

FIG. 3 is a block diagram which illustrates a computer and printer which can be employed to practice the method illustrated in FIG. 2; and FIGS. 4 and 5 are diagrams which illustrate a printer head (also illustrated in block diagram form in FIG. 3) printing a photo-resist pattern directly onto a substrate, thereby obviating the need for steps such as masking, exposing the surface to UV light and developing.

DESCRIPTION

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

As discussed above, FIG. 1 is a diagram which illustrates the steps of a prior art method of forming a conductive pattern on a dielectric substrate. As shown, the method includes many steps and includes such steps as masking, exposing the surface to UV light and developing. In contrast, FIG. 2 is a diagram which illustrates a method which is in accordance with an embodiment of the present invention. The method provides that a photo-resist image is directly applied to a substrate, thereby obviating the need to perform steps such as masking, exposing the surface to UV light and developing.

Specifically, as shown in FIG. 2, the method provides that a conductive film 40, such as copper film, is bonded to a dielectric substrate 42. The dielectric substrate 42 may be formed from resins such as bismaleimide triazine (BT), cyanate esters, glass-reinforced epoxy or polyimides. Then, a photo-resist image or pattern 44 is applied directly to the copper film 40.

As shown in FIG. 3, the photo-resist image or pattern 44 may be applied directly to the copper film 40 using a printer 46, such as an ink jet printer. Specifically, a CAD image of the pattern, or other data relating to the image or pattern to be printed) may be communicated by a computer 48 to an ink jet printer 46 which is connected to, or otherwise in communication with, the computer 48. In making the photo-resist image 44 (see FIG. 2), which is also the positive image of the substrate design, a very thin layer of photo-resist is printed directly on the surface of the copper film 40. Preferably, the printer head 50 (shown in FIGS. 3–5) of the printer 46 is designed to handle the viscosity of the liquid material which is used, and which material handling system is capable of handling typical substrate thicknesses and dimensions, such as substrate panel sizes of up to 510×405 mm and thicknesses ranging from 50 to 500 micrometers.

A conventional ink-jet printer prints an image using tiny capillary tubes where tiny drops of ink (in the case where the present method is being practiced, the ink will be a photo-resist) are dropped on the surface of the media, which, in this case is a copper metal surface clad on the dielectric. FIGS. 4 and 5 illustrate the printer head 50 (arrows 60 represent the preferred direction of movement of the printer head 50 during printing) being used to print an image or pattern 44 onto the copper surface 40. The size of the droplets coming out of the printer head 50 are preferably controlled by, for example, a piezo-electric control valve, where the opening of the capillary opens and closes relative to the current applied thereto. Multiple capillaries can be employed when wider photo-resist width is required. The "ink" is preferably a photo-resist material in liquid form which is quick-drying and has a low viscosity to facilitate fast, but stable prints. The supply and flow of the liquid to the printer head 50 preferably comes from a reservoir to accommodate mass printing. On top of the nozzle or capillary jet being controlled by the printer 46, the reservoir is also preferably regulated by a control system to ensure even thickness and maintain good resolution of the photo-resist pattern 44 during printing. Depending on the size of the capillaries and the sensitivity of the piezo-electric control valve or the homogeneous properties of the photo-resist, the size of the droplet is assumed to be in the range of 30 to 50 micrometers in diameter. When multiple droplets are dropped in succession with about 50% overlap from each other, a straight or curved line can be produced quickly with the desired line width to mask the wanted copper trace thereunder.

After printing the photo-resist pattern is dried or cured. As shown in FIG. 2, after the photo-resist image or pattern has been printed onto the copper surface, the portion(s) of the copper film which is exposed (i.e., which is not covered by the photo-resist pattern) is removed, such as by etching. Then, the photo-resist pattern is removed from the surface of the "wanted" copper traces, such as by using a conventional photo-resist etchback process.

A method which is in accordance with an embodiment of the present invention provides that a photo-resist image is directly applied to a substrate. Hence, there is no need to perform such steps as masking, exposing the surface to UV light and developing. As such, the method requires less steps than a presently widely used method (see FIG. 1). Additionally, due to the dot or pixel level generation of the photo-resist image, the result is an evenly spread thin layer of photo-resist across the panel, and this is crucial to fine etching. The method provides fast part turn around, and can have a major impact on cost reduction. Furthermore, the method eliminates the expensive photomask generation process and equipment and all the related overhead cost, and eliminates the alignment, exposure/developing process and equipment and all the related overhead cost. The method also produces less waste and can provide higher yields due to less process steps.

While an embodiment of the present invention is shown and described, it is envisioned that those skilled in the art may devise various modifications of the present invention without departing from the spirit and scope of the appended claims. For example, the method may be applied to motherboards, and the printing can be performed using a laser printing method.

What is claimed is:

1. A method of forming a photo-resist image on a substrate comprising: providing a printer; providing data to the printer, said data relating to the photo-resist image; and having the printer use the data to print photo-resist ink onto the substrate to form the photo-resist image directly onto the substrate.

2. A method as defined in claim 1, wherein said step of providing a printer comprises providing an ink jet printer.

3. A method as defined in claim 1, wherein said step of providing data to the printer comprises providing a computer in communication with the printer and using the computer to send the data to the printer.

4. A method as defined in claim 1, wherein said step of providing data to the printer comprises providing a CAD image to the printer.

5. A method as defined in claim 1, further comprising applying a copper film to a dielectric substrate, and printing the photo-resist image directly onto the copper film.

6. A method as defined in claim 5, further comprising removing at least a portion of the copper film after printing the photo-resist image on the copper film.

7. A method as defined in claim 6, wherein the step of removing at least a portion of the copper film after printing the photo-resist image on the copper film comprises etching.

8. A method as defined in claim 6, further comprising removing at least a portion of the photo-resist image which has been printed on the copper film.

9. A method as defined in claim 8, wherein the step of removing at least a portion of the photo-resist image which has been printed on the copper film comprises etching.

10. A method as defined in claim 1, wherein the method does not include a step of applying a mask to the photo-resist image.

11. A method as defined in claim 1, wherein the method does not include a step of exposing the photo-resist image to UV light.

12. A method of forming a photo-resist pattern on a substrate without having to use a photo-mask and without having to perform steps of exposing to UV light and developing, said method comprising applying a copper film to a dielectric substrate, and using photo-resist ink to print the photo-resist image directly onto the copper film.

13. A method as defined in claim 12, further comprising removing at least a portion of the copper film after applying the photo-resist image on the copper film.

14. A method as defined in claim 13, wherein the step of removing at least a portion of the copper film after applying the photo-resist image on the copper film comprises etching.

15. A method as defined in claim 13, further comprising removing at least a portion of the photo-resist image which has been applied to the copper film.

16. A method as defined in claim 15, wherein the step of removing at least a portion of the photo-resist image which has been applied to the copper film comprises etching.

17. A method as defined in claim 12, wherein the step of applying the photo-resist image directly onto the copper film comprises printing the photo-resist image directly onto the copper film.

18. A method as defined in claim 12, wherein the step of applying the photo-resist image directly onto the copper film comprises using an ink jet printer to print the photo-resist image directly onto the copper film.

19. A method as defined in claim 18, further comprising providing a computer in communication with the printer and using the computer to send data to the printer relating to the photo-resist image.

20. A method as defined in claim 19, wherein said step of using the computer to send data to the printer comprises providing a CAD image to the printer.

\* \* \* \* \*